United States Patent [19]

Erb et al.

[11] Patent Number: 4,924,191

[45] Date of Patent: May 8, 1990

[54] AMPLIFIER HAVING DIGITAL BIAS CONTROL APPARATUS

[75] Inventors: Lee A. Erb; Alan R. Carr, both of Boulder; Paul G. Beaty, Broomfield; Brian D. Bandhauer, Louisville; Mitchell A. Randall, Boulder, all of Colo.

[73] Assignee: Erbtec Engineering, Inc., Boulder, Colo.

[21] Appl. No.: 340,385

[22] Filed: Apr. 18, 1989

[51] Int. Cl.⁵ ............................................. H03F 3/68
[52] U.S. Cl. .................................. 330/130; 330/289; 330/295; 330/296
[58] Field of Search ............... 330/2, 123, 124 R, 129, 330/130, 134, 267, 273, 289, 295, 296

[56] References Cited

U.S. PATENT DOCUMENTS

| | | | |
|---|---|---|---|
| 3,497,822 | 2/1970 | Beurrier | 330/296 |
| 4,345,215 | 8/1982 | Amada et al. | 330/268 |
| 4,366,447 | 12/1982 | Sugiyama | 330/267 |
| 4,414,477 | 11/1983 | Tallant, II et al. | 358/242 |
| 4,435,652 | 4/1984 | Stevens | 307/297 |
| 4,458,213 | 7/1984 | Quan | 330/267 |
| 4,459,553 | 7/1984 | Diller | 330/85 |
| 4,538,114 | 8/1985 | Kunimi et al. | 330/253 |
| 4,623,786 | 11/1986 | Rodwell | 250/214 A |
| 4,751,472 | 6/1988 | Knobbe et al. | 330/127 |

Primary Examiner—James B. Mullins
Attorney, Agent, or Firm—Dorr, Carson, Sloan & Peterson

[57] ABSTRACT

This amplifier is equipped with a digital bias control apparatus to provide precise, dynamic control over the operating point of a plurality of amplifying elements in the ampliifer. A processor optimizes the operating point of each individual amplifying element as a function of the amplifying element characteristics, the operating environment and the applied input signal. The use of a processor also enables the user to remotely program the operating point of each individual amplifying element in the amplifier. The processor further enables dynamic changes in the operating characteristics of the amplifier as the operating environment of these amplifing elements changes. The processor also generates an alarm signal if any particular amplifying element is operating out of its nominal specifications. This digital bias control apparatus can function in class A, AB, B or C type of amplifiers whether they are tuned or untuned and whether the amplifier operates in a pulsed or continuous mode.

11 Claims, 4 Drawing Sheets

AMPLIFIER HAVING DIGITAL BIAS CONTROL APPARATUS

FIELD OF THE INvENTION

This invention relates to amplifiers and, in particular, to a high frequency power amplifier that includes a digital control system to precisely regulate the operating point of the various amplifying elements in the high frequency power amplifier.

PROBLEM

It is a problem in the field of amplifiers to precisely and dynamically control the operation of the amplifying elements that comprise the amplifier. The precise control of the quiescent point of an amplifying element determines the linearity of the amplifying element operation and even its mode of operation. It is obvious that precise control of the quiescent point of an amplifying element is critical to insure the desired operation of the amplifier.

A problem typically encountered in amplifiers is that the amplifying elements, whether vacuum tubes or transistors, exhibit a fairly significant variation in their characteristics as received from the factory. In addition, variations in operating temperature cause a shift in the operating point of these elements as does aging of the amplifying elements. Therefore changes in the quiescent point in an amplifying element can be caused by dynamic changes in the operating environment, such as temperature shift or aging, or can be caused by the inherent diversity of the devices as produced by the manufacturing process. It is a typical procedure to fine tune the amplifier operation during the amplifier manufacturing process to compensate for the diversity of amplifying elements as received from the factory. This leaves the dynamic changes in operating environment to be compensated for by analog feedback circuitry that is typically found in an amplifier. This analog feedback circuitry can provide some rudimentary control over the quiescent point of the amplifying element, although these feedback schemes typically can not compensate for variation in the operating characteristics of the devices. Therefore, when an amplifying element is replaced in the field, the craftsperson must perform a complicated calibration procedure to compensate for the variation in device characteristics. This calibration process is time consuming, expensive and prone to error.

Typical examples of analog feedback apparatus used to provide some control over the quiescent point of an amplifier are listed below.

U.S. Pat. No. 4,751,472 issued Jun. 14, 1988 to K. H. Knobbe and assigned on its face to Herfurth GmbH discloses a high frequency amplifier that includes a set point adjuster for regulating the anode voltage. This set point adjuster monitors the screen grid current as a variable to limit the anode power dissipation.

U.S. Pat. No. 4,623,786 issued Nov. 16, 1986 to M. J. W. Rodwell and assigned on its face to AT&T Bell Laboratories discloses a transimpedance amplifier for a light guide system. This FET amplifier includes a feedback resistor (32) connected between the amplifier output and the source of a FET shunt device to prevent the d.c. component of large photocurrents from significantly changing the input bias voltage level of the amplifier.

U.S. Pat. No. 4,538,114 issued Aug. 27, 1985 to N. Kunimi et al. and assigned on its face to Hitachi, Ltd. discloses an FET differential amplifier that includes a feedback circuit to stabilize the amplifier operating point at one-half the power source voltage.

U.S. Pat. No. 4,459,553 issued Jul. 10, 1984 to C. D. Diller and assigned on its face to Tektronix, Inc. discloses a follower-type amplifier with a bias voltage self adjustment circuit.

U.S. Pat. No. 4,458,213 issued Jul. 3, 1984 R. Wuan and assigned on its face to Sony Corporation discloses a class AB amplifier that uses a zero crossing detector to sample the voltage across a collector resistor when the amplifier output is zero. The sampled signal is used to control the base bias voltage of the output transistor.

U.S. Pat. No. 4,435,652 issued Mar. 6, 1984 to E. H. Stevens and assigned on its face to Honeywell, Inc. discloses a voltage control circuit for controlling the threshold voltages of FET transistors. A reference FET is used to determine the gate signal requirements of the other FET devices in the circuit.

U.S. Pat. No. 4,345,215 issued Aug. 17, 1982 to N. Amada et al. and assigned on its face to Hitachi, Ltd. discloses an audio frequency power amplifier operating in class B push-pull configuration. This amplifier includes a bias control circuit that varies the bias voltage in accordance with the input signal voltage to prevent cut off of the push-pull transistors.

U.S. Pat. No. 4,414,577 issued Nov. 8, 1983 to J. C. Tallant, II et al. and assigned on its face to RCA Corporation discloses a kinescope driver with an automatic bias control circuit. The automatic bias control circuit maintains the desired cathode black image current level by monitoring cathode current during image retrace blanking intervals. The monitored current is used to generate a correction voltage representing the difference between measured and desired cathode currents. The correction voltage is applied to the kinescope drive amplifier to thereby modify the cathode bias voltage.

U.S. Pat. No. 4,366,447 issued Dec. 28, 1982 to U. Sugiyama and assigned on its face to Pioneer Electronic Corporation discloses a push-pull amplifier that includes a bias compensation circuit to provide additional bias current during high power output intervals.

Thus, all of the above feedback apparatus provide some elemental control over the quiescent point of the amplifying elements as provided by a fixed feedback configuration. None of these arrangements provide flexibility in the control of the operating point of the amplifying elements. In addition, none of these arrangements enable a user to simply vary the quiescent point or operating conditions of the amplifier and none of these arrangements provide for digital control of the operating point of the amplifying elements.

SOLUTION

The above described problems are solved and a technical advance achieved in the field by the present amplifier having digital bias control apparatus that uses a processor to provide precise, dynamic control over the operating point of a plurality of amplifying elements in an amplifier. This processor controls each amplifying element to optimize the operating point of each individual amplifying element as a function of the amplifying element characteristics, the operating environment and the applied input signal. The use of a processor also enables the user to remotely program the operating point of each individual amplifying element in the amplifier. The processor further enables dynamic changes in the operating characteristics of the amplifier as the operating environment of these amplifying elements changes. The processor also generates an alarm signal if any particular amplifying element is operating out of its nominal specifications. This digital bias control apparatus can function in class A, AB, B or C type of amplifiers whether they are tuned or untuned and whether the amplifier operates in a pulsed or continuous mode.

The digital bias control apparatus in the amplifier operates by sequencing through the plurality of amplifying elements contained in the amplifier. Each individual amplifying element is selected by the digital bias control apparatus and placed into a test mode in which the amplifying element is forward biased in the active mode with no input signal applied to the amplifying element. If the amplifier operates in a pulsed mode of operation, the test mode is activated in the intervals between applied input pulse signals. If the amplifier operates in the continuous mode, a forced idle condition is imposed on this amplifying element in order to initiate the test mode. In the test mode, the processor reads a bias value from memory indicative of the desired bias for this particular amplifying element. The power source is regulated to supply this predefined bias signal to the selected amplifying element. The output signal from the amplifying element is monitored to identify the operating point of this amplifying element in the active, forward biased, no input signal condition. If the measured values of bias signal and output signal do not match predetermined desired values as stored in the processor memory, the processor updates the predefined bias value that is stored in memory to therefore shift the nominal operating point of this amplifying element to compensate for dynamic changes in the operating environment or the operating characteristics inherent in this particular device.

The use of a processor programmed with a control algorithm provides both dynamic and precise control over the operating point of every amplifying element in an amplifier. The processor controls the bias signal applied to each amplifying element individually rather than according to a nominal and simplistic arrangement such as is obtained by the use of analog feedback circuitry found in the prior art. The processor also controls the operating point of both vacuum tube and transistor amplifying elements. The processor is equipped with a remote access port that enables a user to reprogram the desired operating point or operating characteristics of the amplifying devices from a remote location or from a test panel in the amplifier circuit to compensate for changes in the code of the amplifying element used or to compensate for variations in the desired operating characteristics of the amplifier as a whole. These and other features and advantages of this amplifier having a digital bias control apparatus can be ascertained by a reading of the detailed description and figures provided herein.

DETAILED DESCRIPTION

Figure 1:
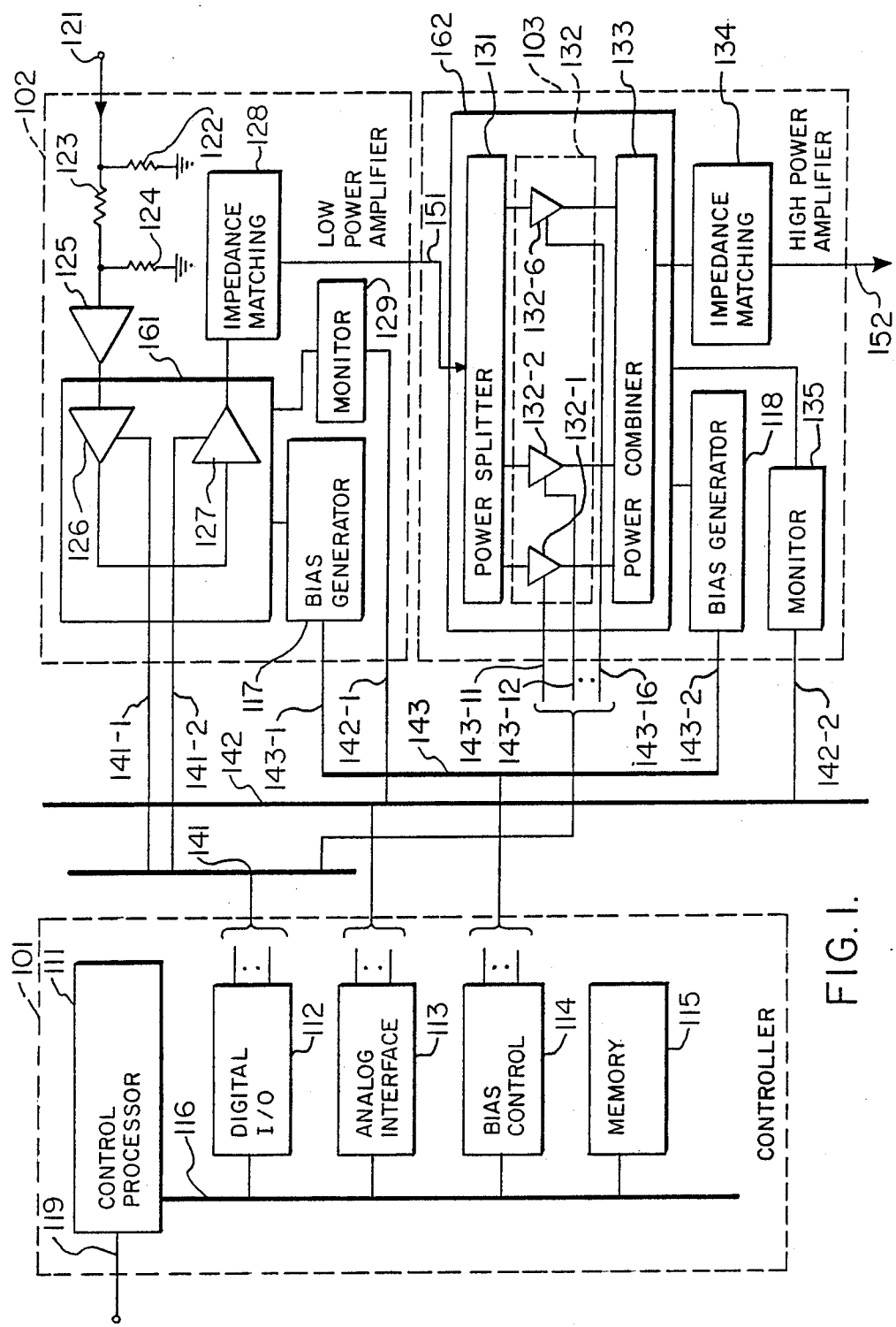
FIG. 1 illustrates the amplifier having digital bias control apparatus in block diagram form.

The amplifier having digital bias control apparatus uses a processor to provide precise, dynamic control over the operating point of a plurality of amplifying elements in an amplifier. This processor controls each amplifying element to optimize the operating point of each individual amplifying element as a function of the amplifying element characteristics, the operating environment and the applied input signal. The use of a processor enables the user to remotely program the operating point of each individual amplifying element in the amplifier. The processor further enables dynamic changes in the operating characteristics of the amplifier as the operating environment of these amplifying elements changes. The processor also can generate an alarm signal if any particular amplifying element is operating out of its nominal specifications. This digital bias control apparatus can function in class A, AB, B or C type of amplifiers whether they are tuned or untuned and whether the amplifier operates in a pulsed or continuous mode.

The digital bias control apparatus in the amplifier operates by sequencing through the plurality of amplifying elements contained in the amplifier. Each individual amplifying element is selected by the digital bias control circuit and placed into a test mode in which the amplifying element is forward biased in the active mode with no input signal applied to the amplifying element. If the amplifier operates in a pulsed mode of operation, the test mode is activated in the intervals between applied input pulse signals. If the amplifier operates in the continuous mode a forced idle condition is imposed on this amplifying element in order to initiate the test mode. In the test mode, the processor reads a bias value from memory indicative of the desired bias for this particular amplifying element. The power source is regulated to supply this predefined bias signal to the selected amplifying element. The output signal from the amplifying element is monitored to identify the operating point of this amplifying element in the active, forward biased, no input signal condition. If the measured values of bias signal and output signal do not match predetermined desired values as stored in the processor memory, the processor updates the predefined bias value that is stored in memory to therefore shift the nominal operating point of this amplifying element to compensate for dynamic changes in the operating environment or the operating characteristics inherent in this particular device.

The use of a processor programmed with a control algorithm provides both dynamic and precise control over the operating point of every amplifying element in an amplifier. The processor controls the bias signal applied to each amplifying element individually rather than according to a nominal and simplistic arrangement such as is obtained by the use of analog feedback circuitry found in the prior art. The processor also controls the operating point of both vacuum tube and transistor amplifying elements. The processor is equipped with a remote access port that enables a user to reprogram the desired operating point or operating characteristics of the amplifying devices from a remote location or from a test panel in the amplifier circuit to compensate for changes in the code of the amplifying element used or to compensate for variations in the desired operating characteristics of the amplifier as a whole.

Definitions

In order to provide a common baseline of description, the following definitions are provided to clarify the terms as used herein. A class A amplifier is one in which the operating point and the input signal are such that the current flows at all times in the output circuit of the amplifier, whether the collector, plate or drain electrode of the amplifying element. A class A amplifier operates essentially over a linear portion of the amplifying element characteristic. A class B amplifier is one in which the operating point of the amplifying element is at an extreme end of its characteristic, so the quiescent power is very small and either the quiescent current or the quiescent voltage is approximately zero. If the input signal is sinusoidal, amplification takes place for only one-half a cycle of the sinusoidal input signal. A class AB amplifier is one operating between the two extremes defined for class A and class B amplifiers. Hence the output signal is zero for part but less than one half of an input sinusoidal signal cycle. A class C amplifier is one in which the operating point of the amplifying element is selected so that output current or voltage is zero for more than one half of an input sinusoidal signal cycle.

A tuned amplifier is one in which the load placed on the amplifier is a tuned circuit that operates near its resonant frequency. A pulsed amplifier mode of operation is one in which a signal is only periodically applied to the input of the amplifier and the periods between pulse signals are ones in which no signal is applied to the amplifier. Continuous mode of operation is where the amplifier continually receives an input signal, which input signal is amplified by the amplifier. Even though an input signal in continuously applied to the amplifier, this input signal may be invariant for a significant period of time or may even be absent for periods of time. However the very nature of continuous mode of operation is that the absence of an input signal is irregular at best. The frequency classification for an amplifier indicates the range of frequencies that are amplified by this circuit. The circuit described below is a radio frequency amplifier which is defined as covering input signals from a few kilohertz to hundreds of megahertz, therefore spanning a tremendous range of input signal frequencies.

Architecture of the Amplifier Having Digital Control Apparatus

FIG. 1 illustrates in block diagram form the general architecture of an amplifier equipped with the digital bias control apparatus of the present invention. This amplifier is a two stage amplifier consisting of: low power amplifier 102 and high power amplifier 103. The low power amplifier 102 receives an input signal on lead 121 from a signal source (not shown) and amplifies this signal to a predefined output level and applies this amplified signal via lead 151 to the input of high power amplifier 103. The signal received from low power amplifier 102 is amplified by high power amplifier 103 into a predetermined high power output signal which is output on lead 152 to a load (not shown).

A typical use of such an amplifier as is illustrated in FIG. 1 is in the field of linear pulse amplifier applications, such as magnetic resonance imaging (MRI) systems. Such a system is the MRI-20K Series Magnetic Resonance Imaging Amplifier manufactured by Erbtec Engineering, Inc. The MRI system typically has three imaging modes of operation. The MRI system requires the amplifier to output a tune-up signal to align the antenna circuitry within the magnet core in preparation for imaging. A second mode of operation is called the head mode which requires a much higher power level output to perform imaging on the head of the individual being tested. The final or third mode of operation is the body mode where still higher power levels are required to obtain an image of the denser, more complicated body of the individual being tested by this apparatus. It is obvious that the output power of the MRI amplifier must be precisely controlled in order to obtain the requisite data output required of this system.

The amplifier illustrated in FIG. 1 as the preferred embodiment of the invention consists of a radio frequency, tuned high power amplifier system operating in the pulsed mode. In such an environment, the amplifying elements in low power amplifier 102 are typically field effect transistor devices, while the high power amplifier 103 is equipped with vacuum tube devices to obtain the high levels of radio frequency power required for this application.

Controller

In order to precisely control the operating point of each amplifying element in this amplifier, controller 101 is provided to test, monitor and regulate the bias signal applied to the amplifying elements in low power amplifier 102 and high power amplifier 103 as disclosed in detail herein below. Controller 101 consists of a control processor 111 having a remote access port 119 that is connected to an optional control panel (not shown) or that can be accessed via a remote dial up telephone link that is well known in the art. Control processor 111 outputs control, data and address signals on bus 116 to regulate the operation of digital input/output circuit 112, analog interface 113 and bias control circuit 114 which are all connected to bus 116. Digital input/output circuit 112 contains a plurality of digital interface circuits that exchange control signals with the various elements in low power amplifier 102 and high power amplifier 103 to control the operation of these two amplifier stages. Analog interface 113 obtains analog data from the amplifier stages in order to measure and monitor the various environmental and operational characteristics of low power amplifier 102 and high power amplifier 103. Included in the characteristics monitored by analog interface 113 are the temperature of operation of the various amplifying elements, the power output of the amplifier stages, the output signal from the various amplifying elements as well as power supply voltages, environmental conditions, etc. Bias control circuit 114 produces the bias control signal for each amplifying element in low power amplifier 102 and high power amplifier 103 under the control of control processor 111. Control processor 111 stores data in memory 115 indicative of the desired operating point of each amplifying element in the amplifier as well as data concerning the environmental and operating conditions of the amplifier. Memory 115 is typically implemented using several different types of devices. A ROM is used to store the operating program and an electrically alterable ROM (EPROM) stores the amplifying element target bias values. These are critical software elements and are stored in non-volatile memory devices while a RAM can be used to store measured bias values, since these measurements are frequently updated by control processor 111.

Low Power Amplifier

Low power amplifier 102 receives high frequency, pulsed input signals on signal lead 121 from an input source (not shown). Resistors 122-124 and operational amplifier 125 perform a well-known input signal conditioning function and applied the modified input signal to the power amplifying segment 161 of low power amplifier 102. The function of power amplifying segment 161 is to amplify the applied input signal and output this signal via impedance matching circuit 128 to output lead 151. The operation of the power amplifying segment 161 is controlled by bias generator 117. Monitor 129 measures various operational parameters of power amplifying segment 161 as well as environmental conditions within low power amplifier 102.

Figure 2:
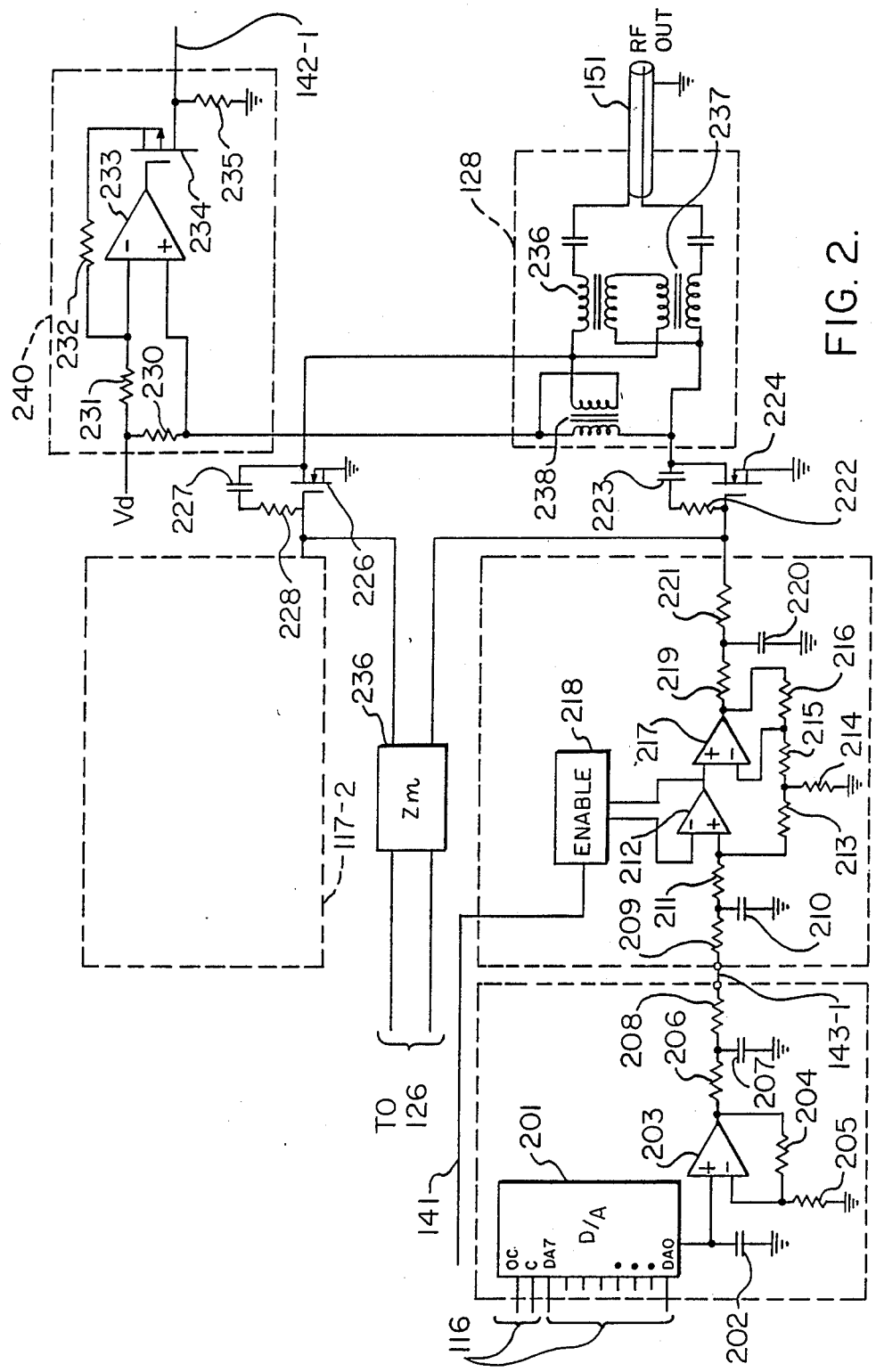
FIGS. 2-3 illustrate various amplifying elements that can be used in the amplifier of FIG. 1.

The power amplifying segment 161 and bias generator 117, both located in low power amplifier 102 are disclosed in additional detail in FIG. 2. FIG. 1 illustrates an amplifier configuration that consists of two series connected amplifier stages 126, 127 located within power amplifying segment 161. Each of these two amplifier stages 126, 127 includes two active amplifying elements 224, 226, each driven by associated bias generators 117-1, 117-2, respectively. In order to simplify the description of this apparatus, only a description of bias generator 117-1 is provided since it is identical in structure to bias generator 117-2. In FIG. 2, the bias generator function is divided into two parts, a first segment designated bias control 114 that is part of the circuitry in controller 101 and bias generator 117-1 which is contained in low power amplifier 102. It is obvious that the distribution of elements shown in FIG. 2 is an arbitrary selection for design convenience and in no way should limit the concepts embodied therein.

Bias Generator

Bias control circuit 114 contains a digital to analog converter circuit 201 which is connected to bus 116 and is responsive to a bias signal value, typically in the form of an eight bit digital signal, applied thereto by control processor 111 to generate an analog signal that is indicative of the bias signal applied to amplifying element 224. Digital to analog convertor 201 also contains a clock input labeled C which receives a select signal from processor 111 that enables control processor 111 to specifically activate amplifying element 224. In addition, input OC on digital to analog converter 201 is used as an on/off switch, again under the control of control processor 111, to switch amplifying element 224 on or off.

The analog signal produced by digital to analog converter 201 in response to the bias value signals applied to bus 116 by control processor 111 is applied to the non-inverting input of differential amplifier 203. A filter capacitor 202 is provided between the digital to analog convertor 201 and amplifier 203 to reduce transients on this signal lead. Differential amplifier 203 includes feedback resistor 204 and bias resistor 205 to produce a bias drive signal that is applied through an RC filter consisting of resistors 206, 208 and capacitor 207 to output lead 143-1. This analog signal applied to signal lead 143-1 travels from bias control 114 of controller 101 to bias generator 117-1 contained in low power amplifier 102. The analog drive signal appearing on lead 143-1 is applied through an RC filter consisting of resistors 209, 211 and capacitor 210 to the non-inverting input of comparator 212. The inverting input of comparator 212 is connected via lead 141-1 to control processor 111. Comparator 212 activates bias generator 117-1 in response to signals applied to the inverting and noninverting inputs of comparator 212. Comparator 212, amplifier 217 and their associated resistors 213, 215, 216 convert the received bias signal into a bias signal that is applied through an RC filter consisting of resistors 219, 221 and capacitor 220 to the gate input of field effect transistor device 224.

Amplifying element 127 consists of field effect transistor devices 224, 226 and their associated AC bias devices (resistor 222, capacitor 223 and resistor 228, capacitor 227, respectively). Field effect transistors 224 and 226 are interconnected with each other, the power source, and the RF output lead 151 via a transformer circuit consisting of impedance matching element 128. The impedance matching element 128 consists of transformers 236, 237 and 238 interconnected as shown in FIG. 2. This is a well known tuned circuit output configuration for matching the impedance of the amplifier stage 127 with the output load. Bias circuit 117-1 applies a predesignated bias to the gate terminal of field effect transistor 224 to bias this device in the active region at a predetermined operating point. The signal to be amplified is applied from the previous amplifying stage 126 via an impedance matching circuit 236. Field effect transistors 224 and 226 amplify the signal applied through impedance matching circuit 236 and output the amplified signal over the RF output signal lead 151.

The power drawn by field effect transistors 224 and 226 through impedance matching circuit 128 is monitored by a current monitor circuit 240 that is part of monitor circuit 129. The current monitor circuit 240 consists of a sense resistor 230 connected in series between the power source Vd and the power lead that is connected to impedance matching circuit 128. The voltage generated across sense resistor 230 by the current flowing therethrough is sensed by differential amplifier 233 with its associated resistors 231, 232. The amount of current drawn by the amplifier 127 through resistor 230 is converted into a sense signal by differential amplifier 233 and applied to field effect transistor 234 which generates a voltage by the application of current to resistor 235, which voltage is indicative of the amount of current drawn by the amplifier 127 through sense resistor 230.

In operation, bias circuits 117-1 and 117-2 apply a bias signal to field effect transistors 224, 226 to establish the operating point of this device. The AC input signal, which is an RF frequency signal, is applied through impedance matching circuit 236 to the gate of transistors 224, 226. Transistor 224 in conjunction with transistor 226, amplifies the input signal applied through the impedance matching circuit 236 and outputs the amplified signal on lead 151. Current monitoring circuit 240 provides a voltage on lead 142-1 to analog interface 113 that is indicative of the current drawn by the amplifier circuit 127 at any instant in time.

Level Bias Set Operation

The dynamic bias level set operation can be divided into two steps: dynamic bias set and dynamic bias refresh. The dynamic bias set step takes place for vacuum tube amplifying elements just as the amplifier is about to enter the full readiness state (OPERATE mode) and for FET amplifying elements as the amplifier enters STANDBY mode. In this operation, processor 111 loads a target bias signal value from the ROM device in memory 115 to the RAM device in memory 115 for each amplifying element. The bias control operation, illustrated in FIG. 4, is then implemented to establish the optimum or selected operating point for each amplifying element in sequence.

The dynamic bias refresh step is analogous to the dynamic bias set step and is used for FET amplifying elements to continually finely adjust their operating point. Any fluctuation in FET operation affects amplifier performance and these devices are very sensitive to temperature and voltage fluctuations. Therefore, processor 111 periodically monitors and finely adjusts the bias of these devices. The dynamic bias refresh step is invoked on a periodic basis during the STANDBY mode and between externally generated UNBLANK signals during the OPERATE mode. In this description, the term UNBLANK refers to a signal that enables an amplifying element to amplify an RF pulse input signal, although it does not imply the presence of an RF pulse on the input of the amplifying element.

Figure 3:
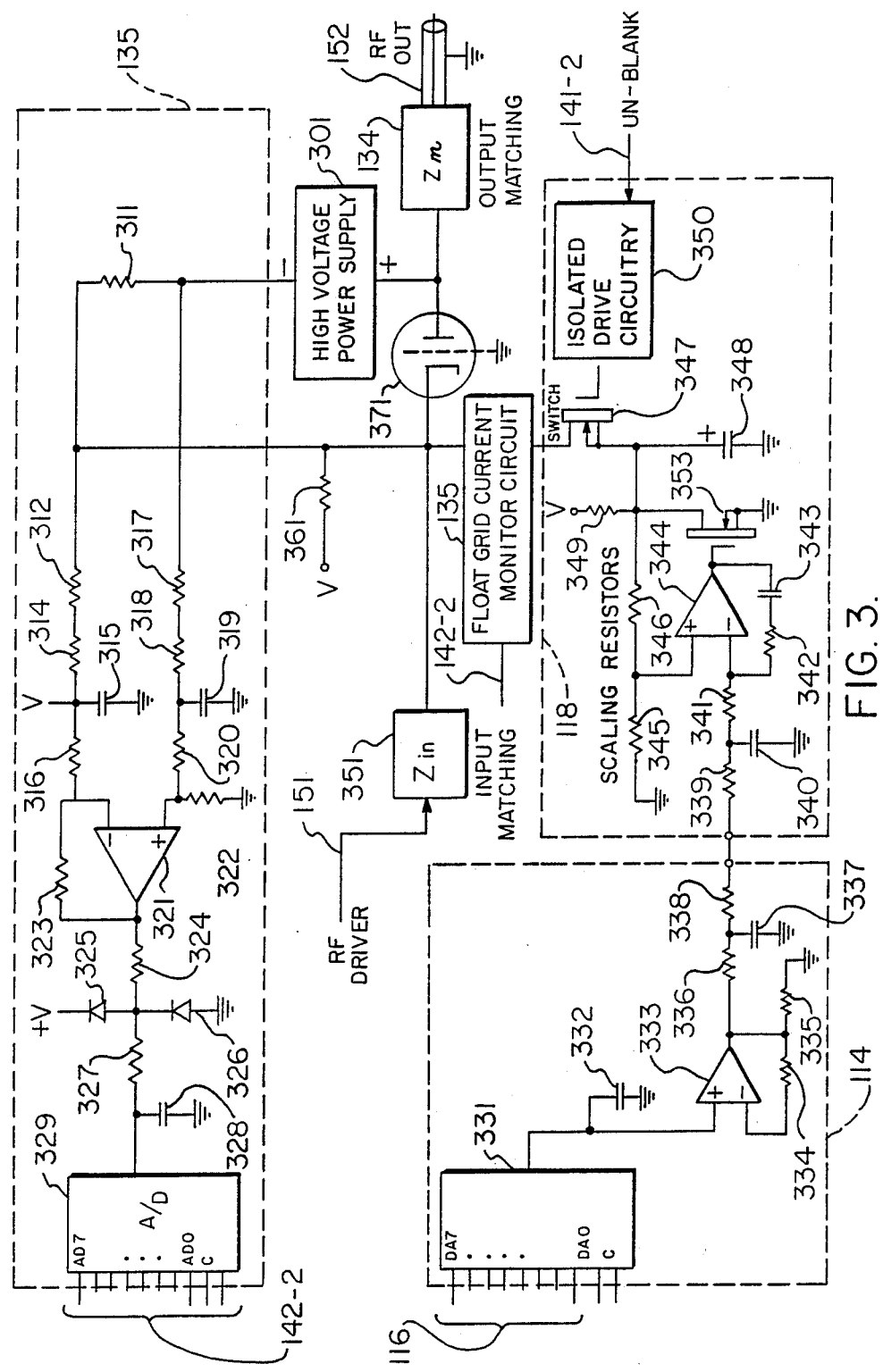
Figure 4:
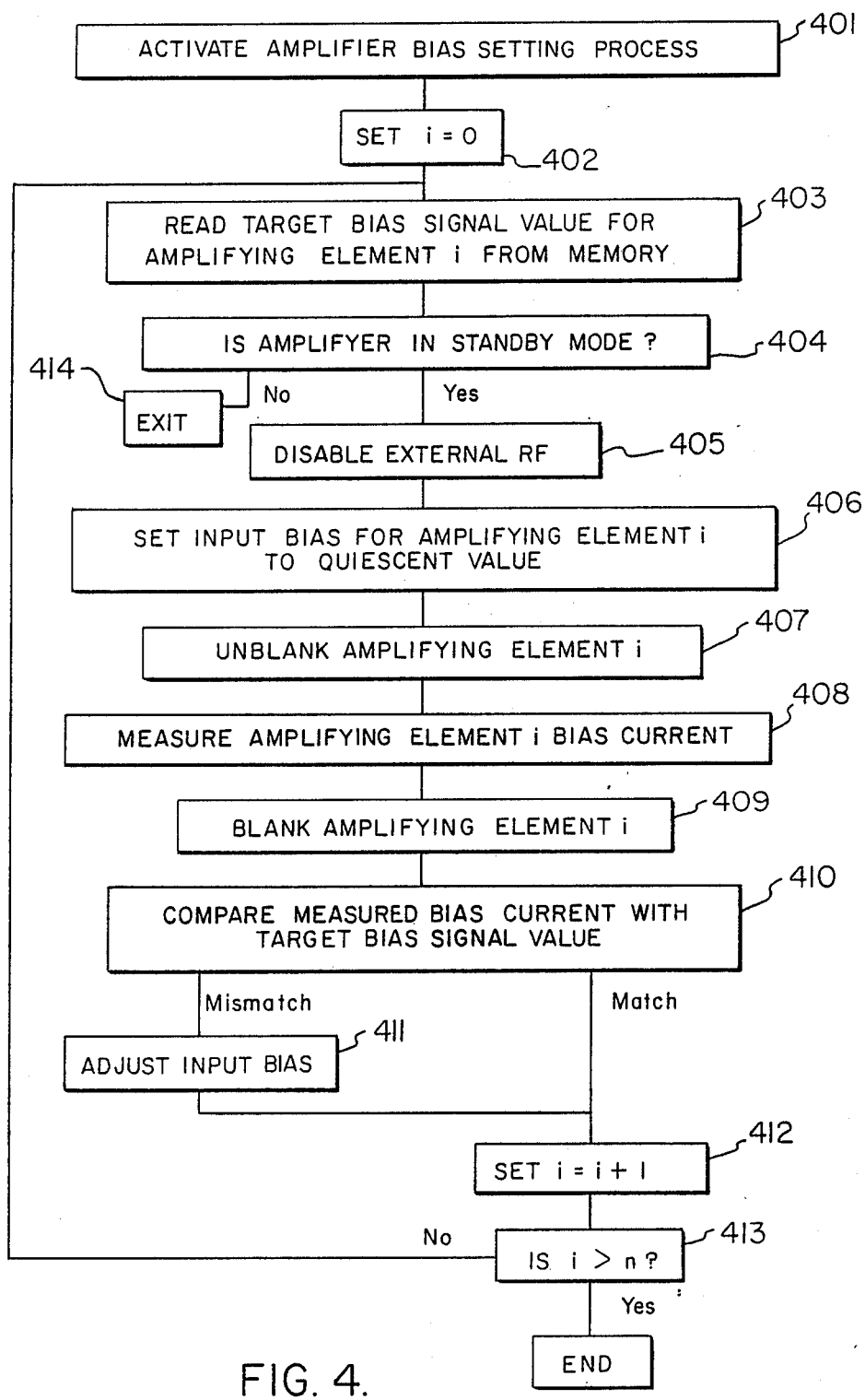
FIG. 4 illustrates in flow diagram form the operational steps taken by the control processor to regulate the operating point of the amplifying elements.

In order to illustrate the functioning of the Bias Level Set Operation, the flowchart of FIG. 4 is used to describe, on a step by step basis, the operation of the circuitry of FIGS. 1–3. The following description is of a typical dynamic bias set step for the FET amplifying elements of FIG. 2.

In order to establish the operating point of field effect transistor 224, control processor 111 initiates the bias control routine at step 401 and initializes a counter at step 402, so that each of the n amplifying elements located in the amplifier are screened in sequence. At step 403, processor 111 reads a predetermined operating point value from memory 115 that is indicative of the bias signal that must be applied to the gate terminal of field effect transistor 224 to bias this device at the designated operating point. At step 404, processor 111 determines whether the amplifier is in the STANDBY mode or in an intrapulse interval in the OPERATE mode. If not, the amplifier is processing an input signal and a bias set or refresh operation cannot take place so the processor must exit this process. If processor 111 determines that this operation can proceed, it disables the external RF signal at step 405 by deactivating input amplifier 125.

The operating point of this amplifying element is now set by applying an input bias signal to the gate terminal of FET 224 and monitoring the quiescent current. Control processor 111 at step 406 outputs an eight bit digital signal on bus 116 that is indicative of the drive signal that must be applied to the gate terminal of field effect transistor 224. This eight bit signal is converted by digital to analog converter 201 into an analog signal that is proportional to the bias signal that must be applied to the gate of field effect transistor 224. Control processor 111 selects digital to analog converter 201 by placing a signal on the clock input of this device to cause the eight bit signal on bus 116 to be loaded therein. Control processor 111 also unblanks this amplifying element at step 407 by applying an enable signal on lead 141-1. Thus, during a test mode, control processor 111 can select digital to analog converter 201 by the use of this select signal while disabling all the other bias generator circuits so that only the operating point of field effect transistor 224 is established during this test cycle. As described above, the analog signal output by digital to analog converter 201 is transformed and transmitted by bias control circuit 114 and bias generator circuit 117-1 and applied to the gate terminal of field effect transistor 224. The current drawn by field effect transistor 224 as a result of the application of this predetermined bias signal is measured at step 408 by current monitor circuit 240.

Thus, during this test cycle, processor 111 can specifically enable, in very controlled fashion, the amplifying element 224 contained within amplifier stage 127 and monitor the operation of this device with all of the other amplifying elements in the amplifier placed in an inactive or cutoff mode. The current measured by current monitoring circuit 240 at step 408 is transmitted to control processor 111 via bus 142 through analog interface circuit 113. Control processor 111 BLANKS this amplifying element at step 409. The analog signal output by current monitor circuit 240 is converted by analog interface 113 into an eight bit digital signal in well known fashion. This eight bit digital signal is read by control processor 111 via bus 116 at step 410 and compared to device characteristic information that is stored in memory 115. This device characteristic information is indicative of the current drawn by a field effect transistor of the type used to implement device 224 in response to a predetermined bias signal. Control processor 111 can therefore drive the exact operating point of field effect transistor 224 based on the bias signal applied to the gate terminal thereof and the measured drain current drawn by this device in response to that bias signal.

If the quiescent current drawn by amplifying element 224, as measured at step 410, does not match the target bias signal value read from memory 115, processor 111 changes the input bias at step 411. This is accomplished by processor 111 modifying the eight bit digital input bias signal value stored in memory 115. Therefore, the input bias generated by bias control 114 and bias generator 117-1 is adjusted to control the operating point of amplifying element 224. At step 412, the variable i is incremented and compared with n at step 413 to determine whether all of the amplifying elements have been tested and the bias signal values refreshed.

The periodically revised bias signal values are written into the RAM portion of memory 115. Any revision of these values that is of a permanent nature can be accomplished via the remote access port 119. These revisions activate memory control circuitry (not shown) that changes the data stored in the EPROM device in memory 115.

As mentioned above, this amplifier is operated in a pulse mode. Therefore this test cycle appears in the interval between the application of RF signal pulses to input 121. The test described therefore measures the DC response of field effect transistor 224 without the application of any RF input signal through impedance matching circuit 236. Control processor 111, in response to the measured drain current and applied bias signal as well as other operational parameters that are measured by various sensors within the system (such as operating temperature, power supply voltages, etc.), can determine whether the operating point of field effect transistor 224 is to be adjusted. If the measured operating point and associated environmental parameters differ from a desired set of values by greater than a predesignated amount, control processor 111 generates a new value for the bias signal that is applied to field effect transistor 224. This new value is written into memory 115 in place of the originally stored value and also transmitted to digital to analog converter 201 where it is stored for use by amplifier 127 in maintaining field effect transistor 224 in its desired operating point.

In similar fashion, the other amplifying elements contained within power amplifier segment 161 are controlled in this fashion.

High Power Amplifier - Vacuum Tubes

The above described low power amplifier 102 used field effect transistors as the amplifying elements although bipolar transistor could have been used in a similar configuration. The digital bias control apparatus also functions in an environment where the amplifying element consists of a vacuum tube. FIG. 3 illustrates the application of this digital bias control apparatus to a vacuum tube amplifying element.

High power amplifier 103, illustrated on FIG. 1, serves to provide a second level of amplification to the input signals applied to input lead 121. The once amplified input signals, output by low power amplifier 102 on lead 151, are amplified by power amplifying segment 162 and output via impedance matching circuit 134 to the RF output lead 152. The operation of the amplifying elements 132-1 to 132-6 contained within power amplifying segment 162 are regulated by bias generator 118. Monitor circuit 135 measures various operational parameters of power amplifying segment 162 as well as environmental conditions within high power amplifier 103. Power amplifying segment 162 is illustrated as containing a plurality of parallel connected amplifying elements 131-1 to 131-6 6. The input signal on lead 151 is divided by power splitter 131 and applied equally to each of the amplifying elements 131-1 to 131-6. The output of the amplifying elements 131-1 to 131-6 are combined by power combiner 133 and applied to impedance matching circuit 134. For the purpose of simplicity, all of power amplifying segment 162 is illustrated as a two amplifying element embodiment shown in FIG. 3.

As with the circuitry described above with respect to FIG. 2, part of the bias circuitry is located in controller 101 while the remainder is contained within high power amplifier 103. On FIG. 3, the bias control circuitry labeled 114 is identical in function to that described above with respect to FIG. 2. In particular, a bias signal value in the form of a digital eight bit signal is applied to the input of digital to analog converter 331 and an analog signal representative of the bias signal is output therefrom to bias generator 118 contained within high power amplifier 103. This analog signal is applied through RC filter consisting of resistors 339, 341 and capacitor 340 to the inverting input of differential amplifier 344. An AC feedback RC combination consisting of resistor 342 and capacitor 343 connects the output of differential amplifier 344 with the inverting input in well known fashion. The non-inverting input of differential amplifier 344 is connected to a bias source V. The voltage V is applied through resistor 349, capacitor 348 and the scaling resistors 345, 346 to the non-inverting input of differential amplifier 344. This establishes a DC feedback level for differential amplifier 344 and results in a regulated tube bias voltage stored on capacitor 348. Amplifier 344 controls FET 353 to regulate the tube bias voltage on capacitor 348. The bias voltage capacitor 348 does not vary with the application of the UNBLANK signal to isolation driver circuit 350, but is set by bias control circuit 114.

Thus, when enabled by the signal appearing on lead 143-2, FET 347 applies the cathode/grid bias signal derived from bias control circuit 114 and stored on capacitor 348 to the cathode of this amplifying vacuum tube. Transistor 353 regulates the voltage on capacitor 348. Field effect transistor 347 is driven by the un-blank signal on lead 141-2 through isolated drive circuit 350 and switches the bias to vacuum tube amplifier 371. Thus, field effect transistor 347 controls the amount of bias current applied to the cathode terminal of vacuum tube amplifier 371. The RF drive signal is applied through input matching impedance 351 to the cathode terminal of vacuum tube amplifier 371. Floating high voltage power supply 301 applies a high level voltage signal through impedance transformer and power combiner circuit 133 to the anode terminal of vacuum tube 371. The other terminal of power supply 301 is connected through sense resistor 311 to the cathode terminal of vacuum tube 371. The grid terminal of vacuum tube 371 is grounded. Thus, a fixed anode/cathode bias is applied across vacuum tube 371. The grid/cathode control bias is regulated by the shunting effect of transistor 353 in response to the control signal applied by differential amplifier 344. Bias switch transistor 347 applies a controllable amount of bias voltage on capacitor 348 voltage on the cathode terminal therefore controlling the vacuum tube's plate current.

The amount of current drawn by vacuum tube 371 is monitored by current monitor circuit 135. This circuit functions in similar fashion the current monitor circuit 240 disclosed above. In particular, the current drawn by the vacuum tube 371 through current sense resistor 311 is monitored by differential amplifier 321. The voltage on either side of resistor 311 is applied to the inverting input of differential amplifier 321 by devices 312-316 and to the non-inverting input of differential amplifier 321 by devices 317-320. Feedback resistors 322 and 323 set the operating point of differential amplifier 321. The voltage across sense resistor 311 is amplified by differential amplifier 321 and applied through resistor 324 and clamping diodes 325, 326 to an RC filter consisting of resistor 327 and capacitor 328. The output of this RC filter is applied through analog to digital converter 329 which is part of analog interface 113 where it is converted into an eight bit digital signal and read at the control processor over its I/0 bus 116.

Thus, as above with the transistor amplifier, this vacuum tube amplifier can be placed in a test mode in the interval between signal pulses by the use of the enable select lead controlled by UNBLANK. A predetermined bias signal value has been read out of memory 115 by control processor 111 and transmitted over bus 116 to digital to analog converter 331. The digital bias signal value so obtained from control processor 111 is converted to an analog signal and transmitted to vacuum tube 371 by bias generator 118. The current drawn by vacuum tube 371 in the no input signal mode is sensed by current monitor 303 and this value is returned to control processor 111 via the analog interface 113. In addition, the bias applied to the cathode terminal of vacuum tube 371 is sensed by floating grid current monitor circuit 135 and is transmitted to the analog interface circuit 114 where it is converted to a digital signal and output on bus 116 to control processor 111.

Monitor Circuit

The operation of monitor circuits 129, 135 are described in part above. These circuits not only monitor the output signals of the amplifying elements but also measure various environmental parameters within low and high power amplifiers 102, 103. For example, the operating temperature of the field effect transistor devices in low power amplifier 102 can be measured in well known fashion. Memory 115 can include temperature/operating point data that indicates to processor 111 the modifications required to the operating point of the field effect transistors as a function of variations in operating temperature. Similar environmental factors can be considered by processor 111 in regulating the operating point of all of the amplifier elements.

While a specific embodiment of this invention has been disclosed, it is expected that those skilled in the art can and will design alternate embodiments of this invention that fall within the scope of the appended claims.

I claim:

1. In an amplifier circuit having a plurality of active amplifying elements, a digital control method for regulating the operating point of at least one of said active amplifying elements comprising the steps of:
   storing, in a memory, bias signal values individual to each of said active amplifying elements;
   placing a selected one of said active amplifying elements in an active, no input signal condition;
   reading from said memory a bias signal value individual to said selected active amplifying element;
   applying a bias signal representative of said bias signal value to said selected active amplifying element;
   monitoring the output current of said selected active amplifying element;
   adjusting said bias signal value if said monitored output current varies from a predetermined value by greater than a predetermined amount.

2. The method of claim 1 wherein said step of applying includes the step of:
   converting said bias signal value read from said memory into an analog bias signal representative of said bias signal value.

3. The method of claim 1 wherein said amplifier operates in a pulsed mode, said step of placing includes the step of:
   blanking all of said amplifying elements less said selected amplifying element during the intra-input signal pulse time.

4. The method of claim 1 wherein at least one of said amplifying elements are field effect transistors, said step of applying includes the step of:
   applying a bias voltage to the gate terminal of said selected one of said field effect transistor amplifying elements.

5. The method of claim 1 wherein at least one of said amplifying elements are vacuum tubes, said step of applying includes the step of:
   applying a bias voltage to the control terminal of said selected one of said vacuum tube amplifying elements.

6. The method of claim 1 wherein said step of adjusting includes the steps of:
   modifying said bias signal value associated with said selected amplifying element;
   writing said modified bias signal value into said memory in place of said bias signal value read from said memory by said reading means.

7. The method of claim 1 further including the step of:
   interconnecting said control apparatus with a data link;
   writing, in response to data signals received via said data link indicative of modified bias signal values, said modified bias signal values into said memory in place of the bias signal values stored therein.

8. The method of claim 1 further comprising the step of:
   sequentially selecting each of said amplifying elements in said amplifier.

9. In an amplifier circuit that includes a plurality of amplifying elements, a digital control apparatus for regulating the operating point of said amplifying elements comprising:
   means for storing bias signal values individual to each of said amplifying elements;
   means for selecting an individual one of said amplifying elements for operating point testing;
   means for applying a bias signal representative of the associated one of said stored bias signal values to said selected amplifying element;
   means for monitoring the output signal generated by said selected amplifying element;
   means responsive to said monitored output signal for modifying said associated stored bias signal value if said monitored output signal deviated from a predetermined value by greater than a predetermined amount.

10. The apparatus of claim 9 wherein said apparatus further includes:
    means for enabling remote access by a user to said storing means to modify said stored bias signal values.

11. The apparatus of claim 9 further including:
    means for monitoring at least one environmental parameter in said amplifier;
    means for monitoring at least one operational parameter in said amplifier;
    wherein said modifying means is responsive to said monitored operational parameters for adjusting said stored bias signal value if said monitored parameters vary by greater than a predetermined amount from a nominal value.

* * * * *